US012672266B2

(12) United States Patent
Teranishi

(10) Patent No.: US 12,672,266 B2
(45) Date of Patent: Jun. 30, 2026

(54) ELECTRONIC CONTROL DEVICE

(71) Applicant: Hitachi Astemo, Ltd., Hitachinaka (JP)

(72) Inventor: Minami Teranishi, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 288 days.

(21) Appl. No.: 18/701,402

(22) PCT Filed: Oct. 12, 2022

(86) PCT No.: PCT/JP2022/037975
§ 371 (c)(1),
(2) Date: Apr. 15, 2024

(87) PCT Pub. No.: WO2023/100480
PCT Pub. Date: Jun. 8, 2023

(65) Prior Publication Data
US 2025/0240934 A1     Jul. 24, 2025

(30) Foreign Application Priority Data
Nov. 30, 2021     (JP) ................................. 2021-193791

(51) Int. Cl.
*H05K 7/20*     (2006.01)
(52) U.S. Cl.
CPC ..... *H05K 7/20863* (2013.01); *H05K 7/20154* (2013.01); *H05K 7/20454* (2013.01); *H05K 7/20854* (2013.01)
(58) Field of Classification Search
CPC .......... H05K 7/20436–20454; H05K 7/20854; H05K 7/20863; H05K 7/20163; H05K 7/20154
See application file for complete search history.

(56) References Cited

U.S. PATENT DOCUMENTS

| | | | | |
|---|---|---|---|---|
| 11,330,704 B2 * | 5/2022 | Toyama | ................. | H05K 1/025 |
| 11,406,043 B2 * | 8/2022 | Teranishi | ........... | H05K 7/20409 |
| 12,213,279 B2 * | 1/2025 | Kawakita | ........... | H05K 7/20172 |
| 2005/0128710 A1 * | 6/2005 | Beitelmal | ............. | H10W 40/22 |
| | | | | 361/709 |
| 2021/0175145 A1 * | 6/2021 | Teranishi | .............. | H10W 40/25 |

FOREIGN PATENT DOCUMENTS

| | | | | |
|---|---|---|---|---|
| JP | 2001-298292 A | 10/2001 | | |
| JP | 2012-227350 A | 11/2012 | | |
| WO | WO-2022091596 A1 * | 5/2022 | ........... | H10W 40/10 |
| WO | WO-2022180909 A1 * | 9/2022 | ........... | H10W 40/73 |

OTHER PUBLICATIONS

International Search Report and Written Opinion, with English translations, for PCT/JP2022/037975, dated Dec. 27, 2022, 10 pages.

* cited by examiner

*Primary Examiner* — Zachary Pape
(74) *Attorney, Agent, or Firm* — Foley & Lardner LLP

(57)     ABSTRACT

An electronic control device includes a housing provided with a first boss and a second boss, a circuit board, a first heat generating component, a second heat generating component, a plurality of heat dissipation fins, and a fan. A first projection is provided on an inner surface of the housing. One end side of the first projection is arranged in the state of being connected to the second boss, and the other end side of the first projection extends toward a third region.

15 Claims, 17 Drawing Sheets

ELECTRONIC CONTROL DEVICE

TECHNICAL FIELD

The present invention relates to an electronic control device.

BACKGROUND ART

In a vehicle such as an automobile, for example, an electronic control device (ECU) for engine control, motor control, or the like is mounted. Such an in-vehicle electronic control device usually includes a circuit board on which a heat generating component is mounted. The heat generating component is, for example, an electronic component, which has a large amount of heat generation, such as an electronic circuit. In the electronic control device described above, it is necessary to house the circuit board inside a housing in order to protect the heat generating component and the circuit board. Therefore, it is important how efficiently the heat generated by the heat generating component is released to the outside of the housing.

PTL 1 describes, as a structure for cooling a heat generating component, a structure in which a cooling fan for blowing air toward a metal plate of a housing is provided inside the housing, and the heat generating component mounted on a circuit board and the metal plate of the housing are connected by a heat conductor. In the technique described in PTL 1, even when the heat generating component is arranged at a location that is difficult to be cooled by an original cooling fan, an additional cooling fan is provided inside the housing separately from the original cooling fan, so that the heat generating component can be efficiently and reliably cooled.

CITATION LIST

Patent Literature

PTL 1: JP 2012-227350 A

SUMMARY OF INVENTION

Technical Problem

In the technique described in PTL 1, the cooling fan is arranged inside the housing in the state of facing the metal plate of the housing, and air is blown so that the air from the cooling fan collides with the metal plate. Therefore, there is a risk that the flow of the air sent from the cooling fan collides with the metal plate and is forcibly bent, a fan performance is deteriorated due to this influence, and the heat generating component cannot be efficiently cooled. In addition, the additional cooling fan is arranged inside the housing separately from the main body cooling fan attached to the intake hole of the housing. Therefore, there is a risk that foreign matter such as dust enters the housing through the intake hole of the housing, and the foreign matter is lifted by the cooling fan and adheres to the surface of the circuit board, the heat generating component, or the like, which adversely affects the operation of the electronic control device.

An object of the present invention is to provide an electronic control device capable of efficiently cooling a plurality of heat generating components including a heat generating component arranged at a position away from an air blowing region of a fan without deteriorating a fan performance.

Solution to Problem

In order to solve the above problems, for example, the configuration described in the claims is adopted.

The present application includes a plurality of means for solving the above problems, but one of them is an electronic control device including: a housing which has an inner surface provided with a plurality of bosses including a first boss and a second boss; a circuit board which is housed in an internal space of the housing; a first heat generating component which is mounted on the circuit board and thermally connected to the housing via the first boss; a second heat generating component which is mounted on the circuit board and thermally connected to the housing via the second boss; a plurality of heat dissipation fins which are formed on an outer surface of the housing; and a fan which is mounted on the outer surface of the housing and blows air toward the heat dissipation fin. A first projection protruding toward the circuit board is provided on the inner surface of the housing, and when, in the housing, a region immediately above a mounting position of the first heat generating component is defined as a first region, a region immediately above a mounting position of the second heat generating component is defined as a second region, and a region between the first region and the fan in an air blowing direction of the fan is defined as a third region, one end side of the first projection is arranged in a state of being connected to the second boss, and another end side of the first projection extends toward the third region so as to transport heat generated by the second heat generating component to the third region.

Advantageous Effects of Invention

According to the present invention, it is possible to efficiently cool a plurality of heat generating components including a heat generating component arranged at a position away from an air blowing region of a fan without deteriorating a fan performance.

Problems, configurations, and effects other than those described above will be clarified by the following description of embodiments.

DESCRIPTION OF EMBODIMENTS

Figure 1:
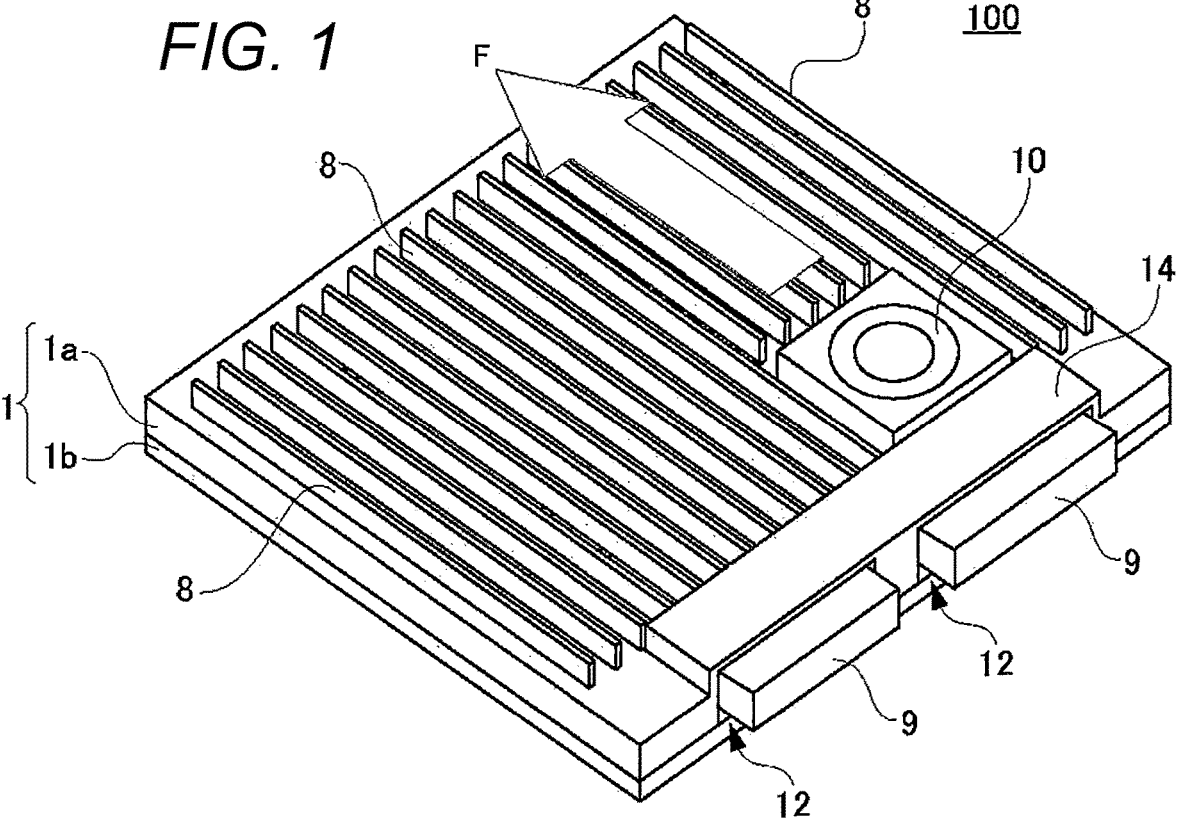
FIG. 1 is a perspective view illustrating an appearance of an electronic control device according to a first embodiment.

Hereinafter, embodiments of the present invention will be described with reference to the drawings. The following description and drawings are examples for describing the present invention, and are omitted and simplified as appropriate for the sake of clarity of description. The present invention can be carried out in various other forms. Unless otherwise specified, each component may be singular or plural.

The position, size, shape, range, and the like of each component illustrated in the drawings may not represent the actual position, size, shape, range, and the like in order to facilitate understanding of the invention. Therefore, the present invention is not necessarily limited to the position, size, shape, range, and the like disclosed in the drawings.

First Embodiment

Figure 2:
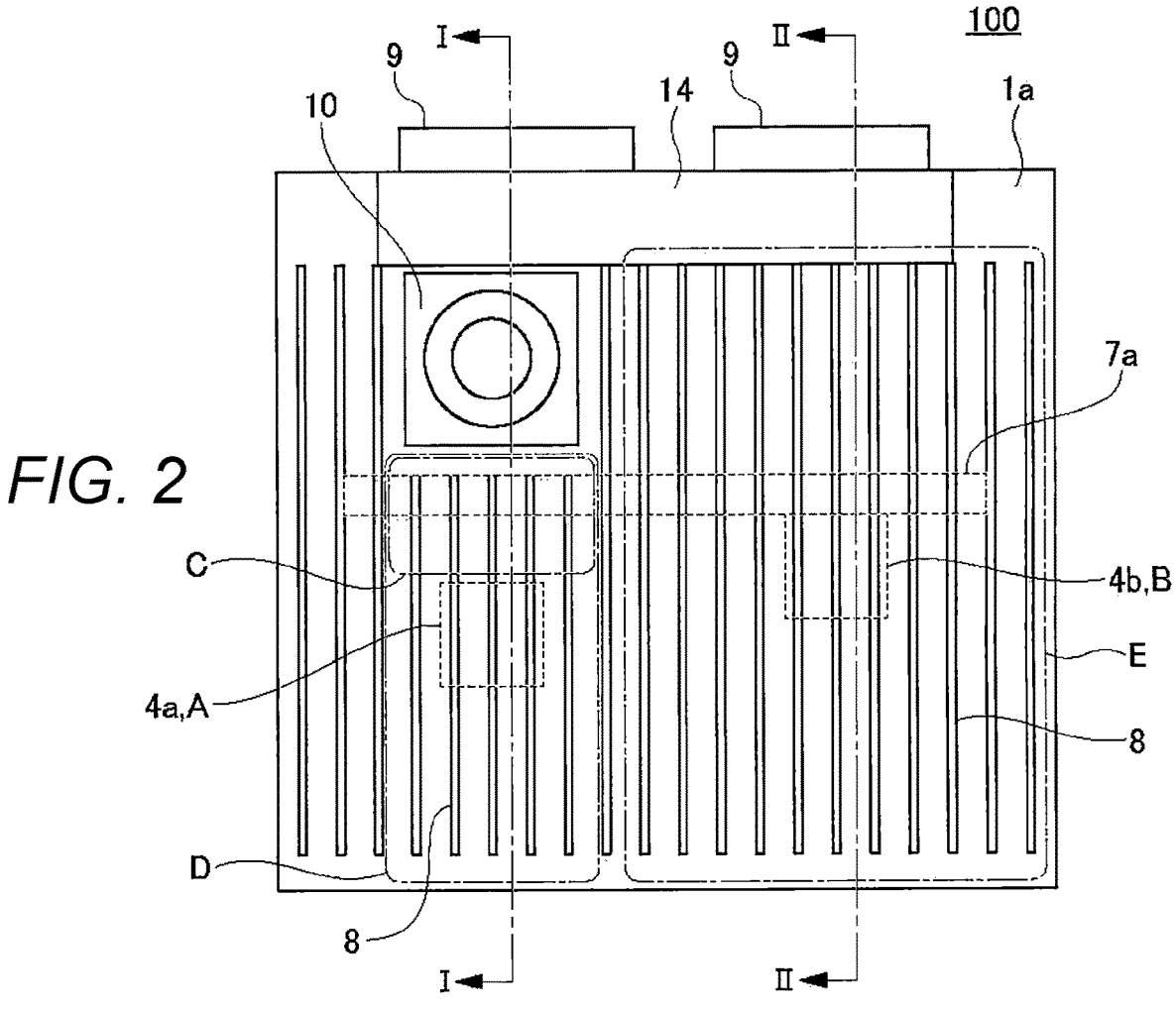
FIG. 2 is a top view of the electronic control device illustrated in FIG. 1.
Figure 3:
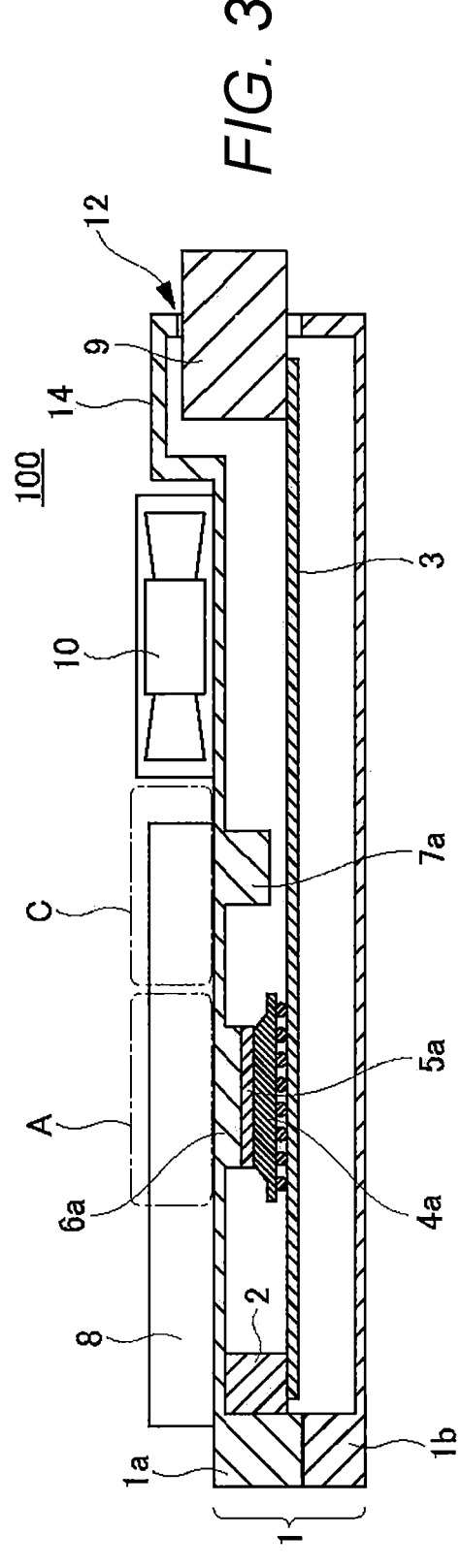
FIG. 3 is a cross-sectional view taken along line I-I of the electronic control device illustrated in FIG. 2.
Figure 4:
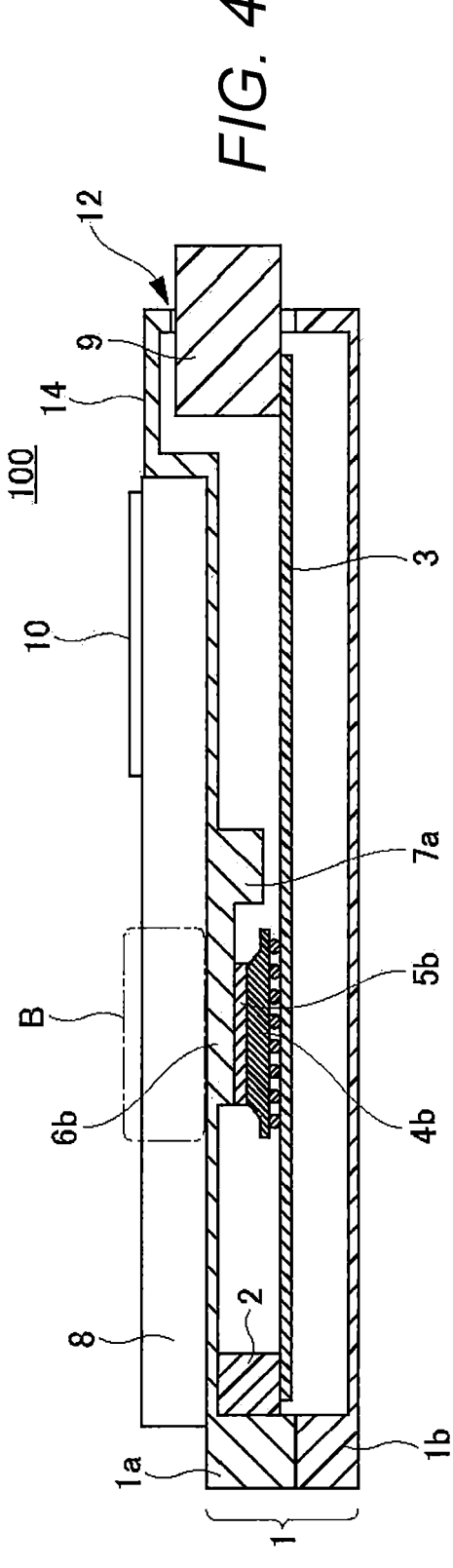
FIG. 4 is a cross-sectional view taken along line II-II of the electronic control device illustrated in FIG. 2.

FIG. 1 is a perspective view illustrating an appearance of an electronic control device according to a first embodiment, and FIG. 2 is a top view of the electronic control device illustrated in FIG. 1. In addition, FIG. 3 is a cross-sectional view taken along line I-I of the electronic control device illustrated in FIG. 2, and FIG. 4 is a cross-sectional view taken along line II-II of the electronic control device illustrated in FIG. 2.

As illustrated in FIGS. 1 to 4, the electronic control device 100 includes a housing 1, a circuit board 3, a first heat generating component 4a, a second heat generating component 4b, a plurality of heat dissipation fins 8, and a fan 10.

The housing 1 is formed in a quadrangular shape in plan view. The housing 1 is constituted by an upper housing 1a and a lower housing 1b. The upper housing 1a and the lower housing 1b are fixed by, for example, a fastening member such as a screw (not illustrated). The upper housing 1a and the lower housing 1b are assembled so as to form a predetermined space inside the housing 1.

Figure 5:
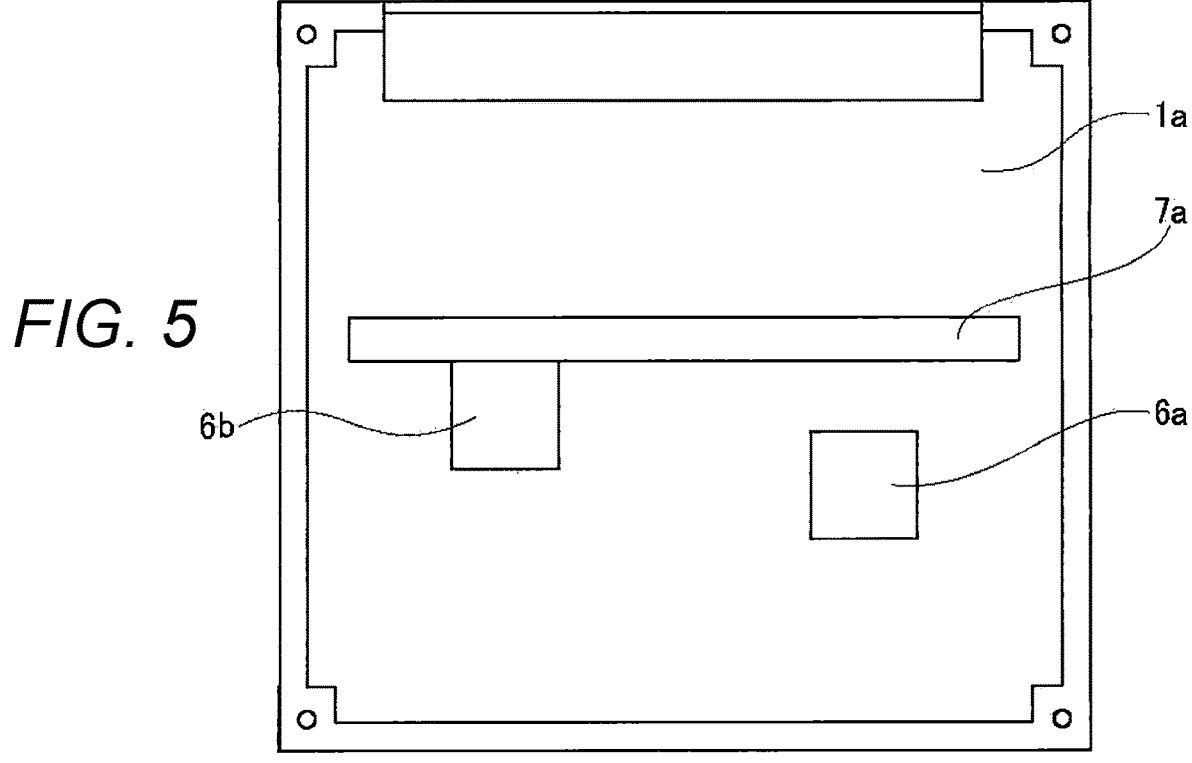
FIG. 5 is a bottom view of an upper housing included in the electronic control device illustrated in FIG. 1.

FIG. 5 is a bottom view of an upper housing included in the electronic control device illustrated in FIG. 1.

As illustrated in FIG. 5, a first boss 6a, a second boss 6b, and a first projection 7a are provided on the lower surface of the upper housing 1a. The lower surface of the upper housing 1a corresponds to the inner surface of the housing 1. The first boss 6a, the second boss 6b, and the first projection 7a are all provided in the state of protruding from the lower surface of the upper housing 1a toward the circuit board 3. The upper housing 1a is preferably formed of a metal material having excellent thermal conductivity, such as aluminum or an aluminum alloy. The upper housing 1a is, for example, a cast product obtained by die-casting aluminum. In that case, it is desirable to form the upper housing 1a using ADC12. Note that the upper housing 1a is not only formed of aluminum or the like, but also formed of a sheet metal such as iron to achieve cost reduction, or the upper housing 1a is formed of a non-metal material such as a resin material to achieve weight reduction. Similarly, the lower housing 1b can be also formed of a sheet metal such as iron or a non-metal material such as a resin material in addition to aluminum or the like.

One or more connectors 9 and an Ethernet (registered trademark) terminal (not illustrated) are arranged on one side of the housing 1. In the present embodiment, as an example, two connectors 9 are arranged on one side of the housing 1. The connector 9 is a connector for electrical connection with an external device (not illustrated), that is, a connector for external connection. An insertion portion 12 for inserting the connector 9 is formed in the housing 1, and a part of the connector 9 is arranged to face the outside of the housing 1 through the insertion portion 12. The insertion portion 12 is formed by a hole, a notch, or the like through which the connector 9 can be inserted. In addition, a stepped portion 14 for forming the insertion portion 12 is formed integrally with the upper housing 1a of the housing 1. The stepped portion 14 is formed in the state of protruding from the upper surface of the upper housing 1a. The connector 9 is connected to a wiring pattern (not illustrated) formed on the circuit board 3. Power supply, transmission and reception of various signals, and the like are performed via the connector 9 and the Ethernet terminal between the electronic control device 100 and an external device (not illustrated).

The circuit board 3 is housed in the internal space of the housing 1. The internal space of the housing 1 is a space surrounded by the upper housing 1a and the lower housing 1b. A boss 2 (FIGS. 3 and 4) protruding toward the circuit board 3 is provided at the corner of the upper housing 1a. The boss 2 is formed integrally with the upper housing 1a. The circuit board 3 is fixed to the boss 2 of the housing 1 with a screw (not illustrated). The circuit board 3 is constituted by, for example, a glass epoxy substrate formed of an organic material such as an epoxy resin. The circuit board 3 is preferably formed of a flame retardant type 4 (FR4) material, but may be constituted by a metal core substrate or the like using a metal material as a base material. The circuit board 3 can be a single-layer substrate or a multilayer substrate.

A plurality of heat generating components including a semiconductor element such as a microcomputer is mounted on the circuit board 3. The plurality of heat generating components are mounted on the upper surface of the circuit board 3 and are electrically and mechanically connected to the circuit board 3 by a bonding material such as solder. In the present embodiment, examples of the plurality of heat generating components mounted on the circuit board 3 include the first heat generating component 4a and the second heat generating component 4b, but the number of heat generating components mounted on the circuit board 3 may be three or more. In addition, a passive element such as a capacitor (not illustrated) is also mounted on the circuit board 3. Further, a wiring pattern (not illustrated) for electrically connecting the heat generating component 4 or the like to the connector 9 or the like is formed on the circuit board 3.

The first heat generating component 4a is constituted by a semiconductor package in which a semiconductor element (semiconductor chip) such as a microcomputer or a central processing unit (CPU) is sealed with a resin. The package structure of the first heat generating component 4a is preferably a ball grid array (BGA). The main heat dissipation path of the first heat generating component 4a is a path passing through the upper surface of the first heat generating component 4a. The first heat generating component 4a includes a heat spreader or the like for promoting heat dissipation of a semiconductor element as a heat generator, and the heat spreader or the like is arranged in the state of being exposed to the upper surface of the first heat generating component 4a. Therefore, the amount of heat dissipation of the first heat generating component 4a is larger in a path in which heat is dissipated upward by the heat spreader or the like than in a path in which heat is dissipated to the circuit board 3 via solder balls.

A first heat transfer material 5a and the first boss 6a are provided on the first heat generating component 4a. As the first heat transfer material 5a, various kinds of materials such as a grease shape, a gel shape, and a sheet shape can be used. A generally used heat transfer material is a grease-like heat conductive material, and more specifically, is a thermosetting resin having adhesiveness, a semi-cured resin having low elasticity, or the like. The first heat transfer material 5a contains a filler formed of metal, carbon, ceramic, or the like and having excellent thermal conductivity. The first heat transfer material 5a is preferably formed of a material with flexibility that allows deformation with respect to the deformation or vibration of the circuit board 3 due to heat and the tolerance at the time of manufacturing. Specifically, for example, the first heat transfer material 5a is preferably formed of a semi-cured resin using a silicon-based resin containing a ceramic filler. The first heat transfer material 5a is laminated on the above-described heat spreader with a predetermined thickness to thermally connect the first heat generating component 4a and the first boss 6a. The first boss 6a is formed in a quadrangular shape in accordance with the outer shape of the first heat generating component 4a. In addition, the first boss 6a is provided in a convex shape on the lower surface of the upper housing 1a in the thickness direction (height direction) of the housing 1 in order to fill a gap between the first heat generating component 4a and the upper housing 1a. Accordingly, the heat generated by the first heat generating component 4a is transferred to the upper housing 1a of the housing 1 via the first heat transfer material 5a and the first boss 6a. In addition, the configuration is made such that the heat of the first heat generating component 4a transmitted to the upper housing 1a is released to the outside of the housing 1 through convective heat transfer in which air is blown from the fan 10 to the space between the heat dissipation fins 8.

Similarly to the first heat generating component 4a, the second heat generating component 4b is constituted by a semiconductor package in which a semiconductor element such as a microcomputer or a CPU is sealed with a resin. The package structure of the first heat generating component 4a is preferably a BGA. Similarly to the first heat generating component 4a, the second heat generating component 4b includes a heat spreader and the like. Therefore, the main heat dissipation path of the second heat generating component 4b is a path passing through the upper surface of the second heat generating component 4b.

The second heat transfer material 5b and the second boss 6b are provided on the second heat generating component 4b. The second heat transfer material 5b thermally connects the second heat generating component 4b and the second boss 6b. Details of the second heat transfer material 5b are the same as those of the first heat transfer material 5a described above, and thus the description thereof will be omitted. The second boss 6b is formed in a quadrangular shape in accordance with the outer shape of the second heat generating component 4b. In addition, the second boss 6b is provided in a convex shape on the lower surface of the upper housing 1a in the thickness direction of the housing 1 in order to fill a gap between the second heat generating component 4b and the upper housing 1a. Accordingly, the heat generated by the second heat generating component 4b is transferred to the upper housing 1a of the housing 1 via the second heat transfer material 5b and the second boss 6b.

Note that the semiconductor element included in at least one heat generating component of the first heat generating component 4a or the second heat generating component 4b may be a semiconductor element such as a gigabit Ethernet integrated circuit (IC), a memory IC, or a power supply IC. In addition, the package structure of at least one heat generating component of the first heat generating component 4a or the second heat generating component 4b may be, for example, a quad flat package (QFP) or a quad flat non-leaded package (QFN). That is, the package structure of the first heat generating component 4a and the second heat generating component 4b is not limited to a specific structure.

The first projection 7a is formed as a protruding portion having a convex shape on the lower surface of the upper housing 1a. Here, the arrangement of the first projection 7a will be described with reference to FIGS. 2 and 5. The first projection 7a linearly extends long in a direction intersecting with the plurality of heat dissipation fins 8 (a right-left direction in FIG. 2). In the longitudinal direction of the first projection 7a, one end side of the first projection 7a is arranged in the state of being connected to the second boss 6b as illustrated in FIG. 5. In other words, one end side of the first projection 7a is arranged at a position continuous with the second boss 6b. The other end side of the first projection 7a extends toward a region between the fan 10 and the first heat generating component 4a. As described above, the first projection 7a is formed integrally with the upper housing 1a by casting such as die casting. However, the first projection 7a may be manufactured as a separate member from the upper housing 1a, for example, a heat pipe, a vapor chamber, or a member made of a metal material having high thermal conductivity such as Cu or Al, and this member may be attached to the upper housing 1a.

The plurality of heat dissipation fins 8 are formed on the upper surface of the upper housing 1a. The upper surface of the upper housing 1a corresponds to the outer surface of the housing 1. The heat dissipation fin 8 is formed integrally with the upper housing 1a when the upper housing 1a is constituted by a cast product. However, the heat dissipation fin 8 may be manufactured as a separate member from the upper housing 1a and attached to the upper housing 1a. The same applies to the first boss 6a and the second boss 6b.

The fan 10 is a fan for air cooling, and blows air in an F direction of FIG. 1. The fan 10 is mounted on the upper surface of the upper housing 1a. Therefore, there is no possibility that foreign matter such as dust is lifted inside the housing 1 by the air blown by the fan 10. The above-described first projection 7a is arranged on the side opposite to the fan 10 in the thickness direction of the upper housing 1a. Therefore, regardless of the shape or arrangement of the first projection 7a, the presence of the first projection 7a does not hinder the air blown from the fan 10. The fan 10 is arranged close to one side of the housing 1 on which the connector 9 is arranged. Specifically, the fan 10 is arranged at a position adjacent to the stepped portion 14. Accordingly, the fan 10 is arranged in the vicinity of the connector 9. By arranging the fan 10 in the vicinity of the connector 9 in this manner, the connector 9 and the fan 10 can be easily wired, and the length of the wiring can be shortened. Among the plurality of heat dissipation fins 8 formed on the upper surface of the upper housing 1a, some of the heat dissipation fins 8 are formed to be shorter than the other heat dissipation fins 8 so as not to interfere with the mounting position of the fan 10. In addition, the plurality of heat dissipation fins 8 are arranged in the air blowing direction F of the fan 10. These heat dissipation fins 8 are arranged along the air blowing direction F of the fan 10. Therefore, the air sent from the fan 10 flows to the space between the heat dissipation fins 8.

The fan 10 can be regarded as a refrigerant circulation device for circulating air as a refrigerant. The fan 10 is preferably a centrifugal fan or a blower fan. The fan 10, which is a centrifugal fan or a blower fan, is configured to bend the sucked air by 90° inside the fan and exhaust the air. Therefore, the fan 10 is mounted in close contact with the upper surface of the upper housing 1a, which can contribute to height reduction of the electronic control device 100. However, the fan 10 is not limited to the centrifugal fan or the blower fan, and may be, for example, an axial fan. In this case, the axial fan may be mounted with an appropriate gap provided between the axial fan and the upper surface of the upper housing 1a, so as to allow air to be sent from the axial fan to the space between the heat dissipation fins 8.

Here, the upper housing 1a is defined by being divided into a plurality of regions. As illustrated in FIGS. 2 to 4, the upper housing 1a has a first region A, a second region B, and a third region C. These regions are divided by the mounting positions of the first heat generating component 4a, the second heat generating component 4b, and the fan 10 and the air blowing direction. Specifically, the first region A is a region immediately above the mounting position of the first heat generating component 4a. The heat dissipation fins 8 existing in the first region A are cooled by the air sent from the fan 10. That is, the first region A is configured to dissipate heat by forced air cooling. The second region B is a region immediately above the mounting position of the second heat generating component 4b. The heat dissipation fins 8 existing in the second region B are configured to dissipate heat mainly by natural air cooling. The third region C is a region between the first region A and the fan 10 in the air blowing direction F (FIG. 1) of the fan 10.

The first region A is positioned in the air blowing direction F of the fan 10. Therefore, the first region A has a higher heat dissipation effect than the second region B. In order to increase the heat dissipation efficiency of the electronic control device 100, the amount of heat generated by the first heat generating component 4a is preferably larger than the amount of heat generated by the second heat generating component 4b.

The arrangement of the first projection 7a described above is described in terms of regions as follows. First, one end side of the first projection 7a is arranged at a position adjacent to the second region B. In addition, the other end side of the first projection 7a extends toward the third region C. That is, the first projection 7a extends from the second region B toward the third region C. Accordingly, the heat generated by the second heat generating component 4b is transported to the third region C through the first projection 7a. Therefore, the heat of the second heat generating component 4b transported to the third region C through the first projection 7a can be actively dissipated by convective heat transfer using the air sent from the fan 10 toward the third region C.

Further, the third region C is positioned between the fan 10 and the first region A, that is, upstream of the first region A in the air blowing direction F of the fan 10. Therefore, the air sent from the fan 10 is supplied to the third region C in a cooled state before being warmed by taking heat from the first heat generating component 4a, that is, in a cold air state. Therefore, a temperature gradient increases between the second region B positioned immediately above the second heat generating component 4b and the third region C receiving the air (cold air) blown from the fan 10, and this temperature gradient promotes heat transfer in the first projection 7a. Thus, the heat of the second heat generating component 4b can be efficiently released to the outside of the housing 1. On the other hand, the air sent from the fan 10 is supplied to the first region A positioned immediately above the first heat generating component 4a. Thus, the heat of the first heat generating component 4a can be efficiently released to the outside of the housing 1.

Note that in FIG. 2, as a preferable example for efficiently transporting heat from the second region B to the third region C, the other end side of the first projection 7a is arranged so as to cross the third region C. However, the present invention is not limited thereto, and the other end of the first projection 7a may be arranged in the third region C or may be arranged in front of the third region C. That is, it is sufficient if the first projection 7a extends toward the third region C so as to transport, to the third region C, the heat generated by the second heat generating component 4b. When the other end of the first projection 7a is arranged in front of the third region C, the first projection 7a does not exist in the third region C, and an empty region is secured on the circuit board 3 immediately below the third region C. Therefore, on the circuit board 3, electronic components (for example, a tall part or the like) necessary for operating the first heat generating component 4a can be arranged near the first heat generating component 4a by using the empty region.

In addition, in FIG. 2, the first projection 7a is formed linearly, but the present invention is not limited thereto, and the first projection 7a may be formed to be partially bent so as not to interfere with a short electronic component such as a capacitor. In addition, the protruding dimension of the first projection 7a with respect to the lower surface of the upper housing 1a may be partially increased or decreased.

As described above, the plurality of heat dissipation fins 8 are formed on the upper surface of the upper housing 1a. The heat dissipation fins 8 are arranged at constant intervals in a direction orthogonal to the air blowing direction F of the fan 10. Preferably, the heat dissipation fin 8 forms a linear flow path through which air can be blown from the fan 10 toward the first region A. Therefore, in the present embodiment, each of the heat dissipation fins 8 is formed in parallel with the air blowing direction F of the fan 10. Accordingly, the air sent from the fan 10 smoothly flows along the heat dissipation fin 8 so as to sequentially pass through the third region C and the first region A. Therefore, the first heat generating component 4a can be cooled without deteriorating a fan performance.

Note that the shape and size of the heat dissipation fin 8 are not limited to the shape and size illustrated in FIGS. 1 and 2, and can be arbitrarily changed. The modifications of the shape or the like of the heat dissipation fin 8 will be described in detail later. Here, a region that is forcibly air-cooled by the air blown from the fan 10 is referred to as a forced air-cooling region D, and a region that surrounds the mounting position of the second heat generating component 4*b* and is naturally air-cooled is referred to as a natural air-cooling region E. In such a case, the forced air-cooling region D is referred to as a region including the first region A and the third region C, and the natural air-cooling region E is referred to as a region including the second region B.

An interval between the heat dissipation fins 8 in the forced air-cooling region D is preferably equal to or narrower than an interval between the heat dissipation fins 8 in the natural air-cooling region E. The reason is as follows.

First, when the interval between the heat dissipation fins 8 in the forced air-cooling region D is narrowed, a large heat dissipation area by the heat dissipation fins 8 is secured, so that the amount of heat dissipation in the forced air-cooling region D can be increased. On the other hand, when the interval between the heat dissipation fins 8 in the natural air-cooling region E is narrowed, air due to natural convection is less likely to enter the back side (the side close to the upper surface of the upper housing 1*a*) of the heat dissipation fins 8. Therefore, in order to efficiently dissipate heat in both the forced air-cooling region D and the natural air-cooling region E, the interval between the heat dissipation fins 8 in the forced air-cooling region D may be equal to or narrower than the interval between the heat dissipation fins 8 in the natural air-cooling region E.

As described above, in the first embodiment, the first projection 7*a* is provided on the lower surface of the upper housing 1*a*. Further, one end side of the first projection 7*a* is arranged in the state of being connected to the second boss 6*b*, and the other end side of the first projection 7*a* extends from the second region B toward the third region C so as to transport, to the third region C, the heat generated by the second heat generating component 4*b*. Accordingly, both the first heat generating component 4*a* arranged in the air blowing region (forced air-cooling region D) of the fan 10 and the second heat generating component 4*b* arranged at a position away from the air blowing region of the fan 10 can be efficiently cooled without deteriorating the fan performance. In addition, the second heat generating component 4*b* arranged at a position away from the air blowing region of the fan 10 can be efficiently cooled, so that the degree of freedom in arranging the second heat generating component 4*b* on the circuit board 3 can be increased.

In addition, in the first embodiment, the first heat generating component 4*a* and the first boss 6*a* are connected by the first heat transfer material 5*a*, and the second heat generating component 4*b* and the second boss 6*b* are connected by the second heat transfer material 5*b*. Accordingly, the heat generated by the first heat generating component 4*a* can be efficiently transferred to the upper housing 1*a* via the first heat transfer material 5*a* and the first boss 6*a*. Similarly, the heat generated by the second heat generating component 4*b* can be efficiently transferred to the upper housing 1*a* via the second heat transfer material 5*b* and the second boss 6*b*.

Second Embodiment

Figure 6:
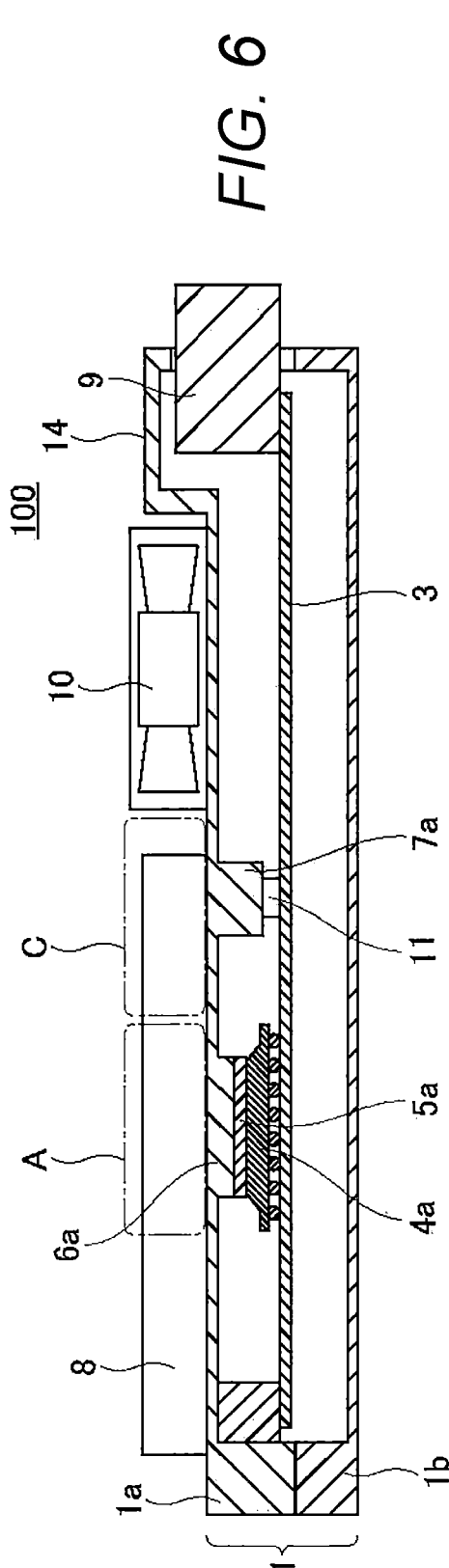
FIG. 6 is a view illustrating a state where an electronic control device according to a second embodiment is sectioned at a position along line I-I in FIG. 2.
Figure 7:
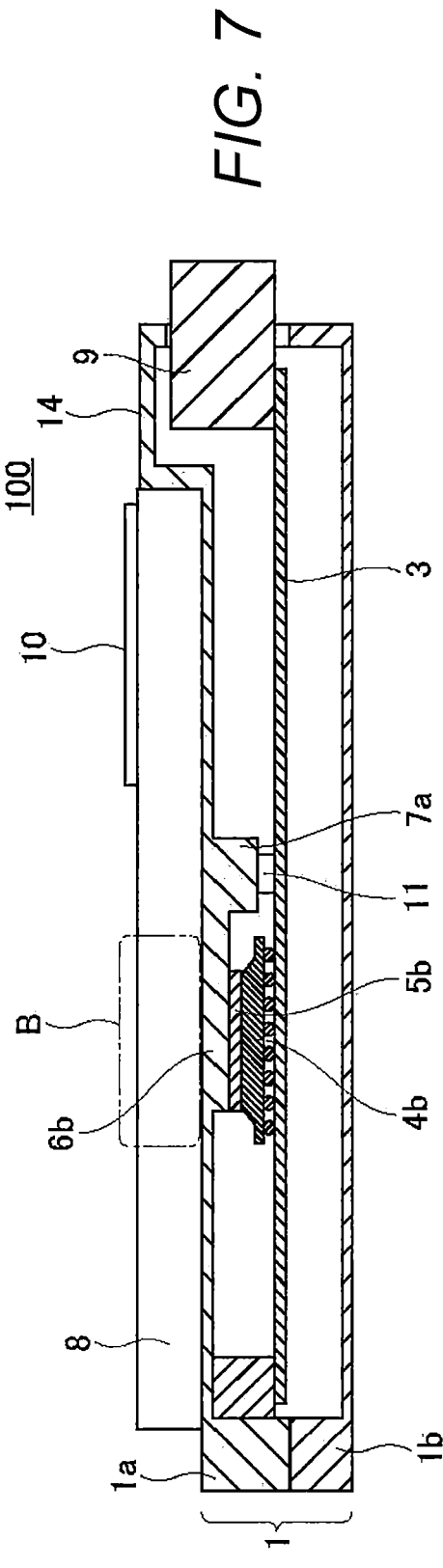
FIG. 7 is a view illustrating a state where the electronic control device according to the second embodiment is sectioned at a position along line II-II in FIG. 2.

FIG. 6 is a view illustrating a state where an electronic control device according to a second embodiment is sectioned at a position along line I-I in FIG. 2, and FIG. 7 is a view illustrating a state where the electronic control device according to the second embodiment is sectioned at a position along line II-II in FIG. 2.

As illustrated in FIGS. 6 and 7, the electronic control device 100 according to the second embodiment is different from the above-described configuration (FIGS. 3 and 4) of the first embodiment in that a heat transfer member 11 is provided between the circuit board 3 and the first projection 7*a*. The heat transfer member 11 is a member that thermally connects the first projection 7*a* and the circuit board 3. A metal portion not covered with a resist or the like is exposed on the upper surface of the circuit board 3, and the heat transfer member 11 is in contact with the metal portion.

The heat transfer member 11 may be made of a grease-like heat conductive material similarly to the heat transfer material 5 described above, or may be made of a gasket or the like in which a conductive nonwoven fabric is wound around a sponge material. The heat transfer member 11 preferably has flexibility (elasticity) in addition to thermal conductivity. Since the heat transfer member 11 has flexibility, the heat transfer member 11 can be reliably brought into close contact with both the first projection 7*a* and the circuit board 3. In addition, the deformation or vibration of the circuit board 3 due to heat and the tolerance at the time of manufacturing can be absorbed by the deformation of the heat transfer member 11.

Figure 8:
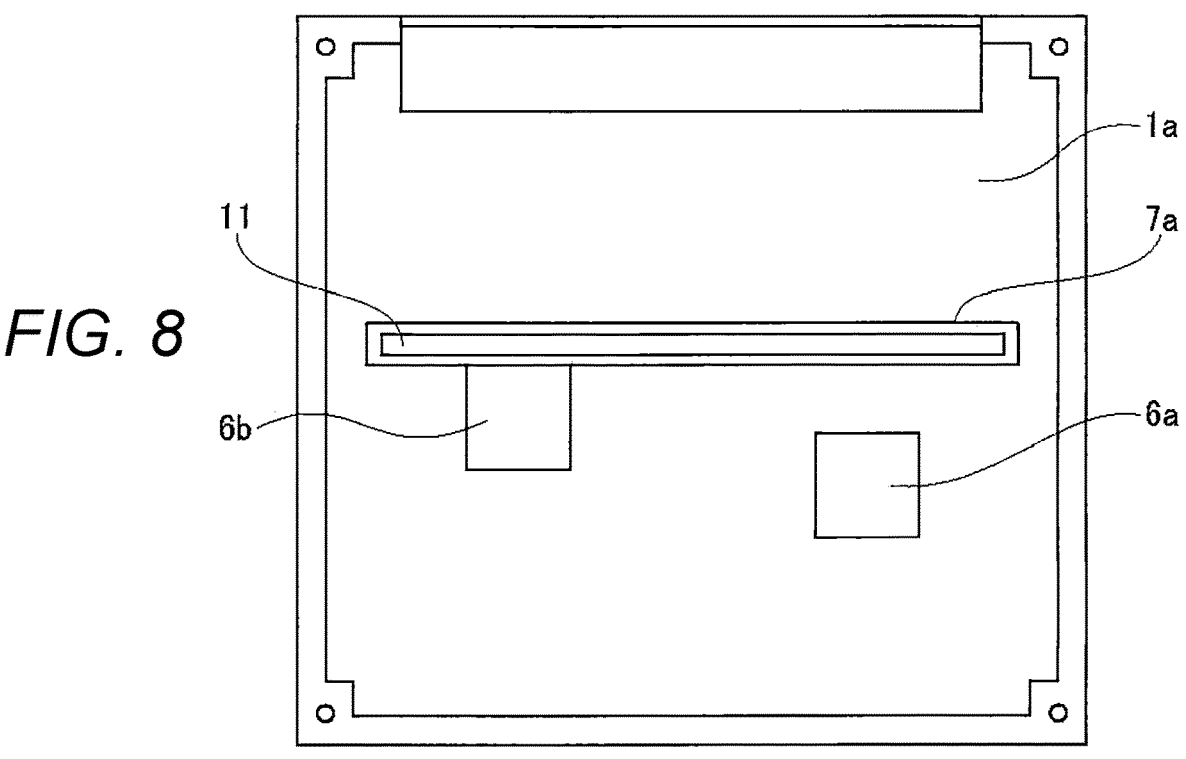
FIG. 8 is a view illustrating a first arrangement example of a heat transfer member in the second embodiment.
Figure 9:
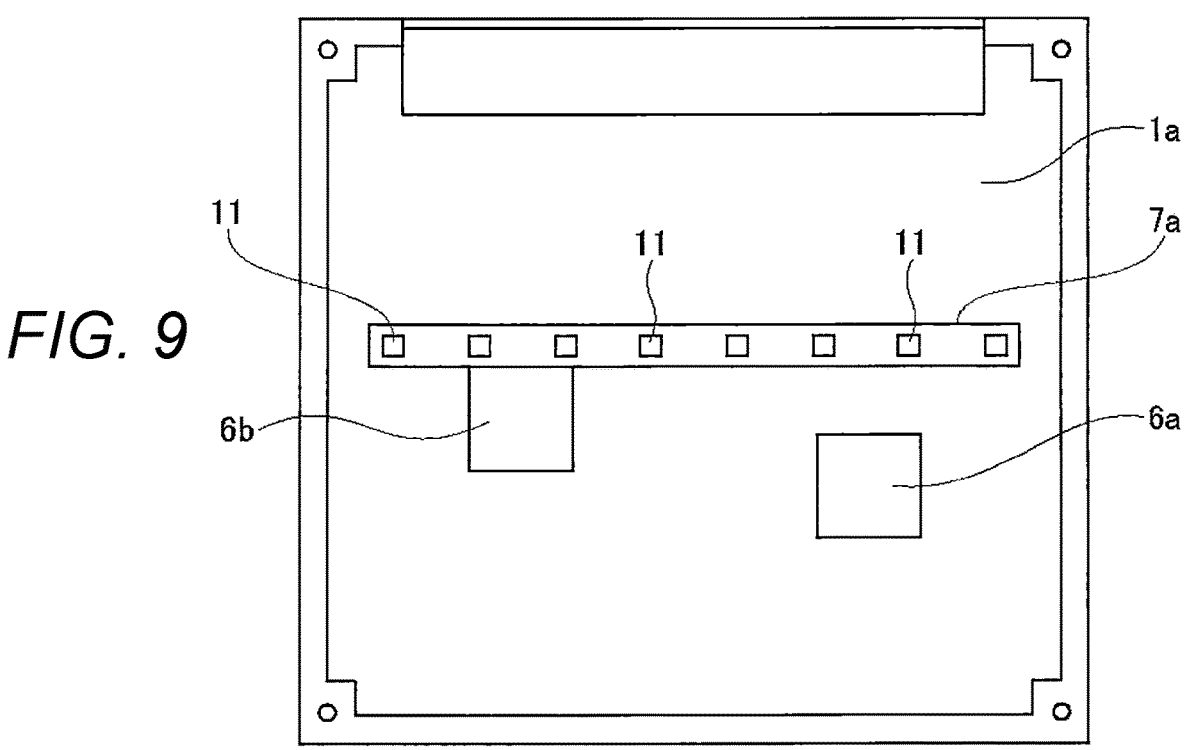
FIG. 9 is a view illustrating a second arrangement example of the heat transfer member in the second embodiment.

The heat transfer member 11 may be continuously formed in a linear shape along the longitudinal direction of the first projection 7*a* as illustrated in FIG. 8, or may be formed in a dotted shape at intervals in the longitudinal direction of the first projection 7*a* as illustrated in FIG. 9. In the configuration in which the heat transfer member 11 is formed in a linear shape, a large contact area of the heat transfer member 11 with respect to the circuit board 3 and the first projection 7*a* can be secured. Therefore, the heat of the circuit board 3 can be efficiently transferred to the first projection 7*a*. In the configuration in which the heat transfer member 11 is formed in a dotted shape, it is possible to flexibly cope with a case where it is necessary to divide the heat transfer member 11 into small parts due to the mounting density of the circuit board 3. The width of the heat transfer member 11 is preferably the same as the width of the first projection 7*a* in order to secure a large contact area. However, the width of the heat transfer member 11 may be narrower than the width of the first projection 7*a*. The width of the heat transfer member 11 refers to the dimension of the heat transfer member 11 in the lateral direction of the first projection 7*a*, and the width of the first projection 7*a* refers to the dimension of the first projection 7*a* in the lateral direction.

Note that in FIG. 9, the interval between the heat transfer members 11 in the longitudinal direction of the first projection 7*a* may be a constant interval or may be different depending on the location. In addition, the size of each of the heat transfer members 11 arranged in the longitudinal direction of the first projection 7*a* may be a constant size or may be different depending on the location.

In the second embodiment, by providing the heat transfer member 11 between the first projection 7*a* and the circuit board 3, heat on other heat generating components (not illustrated), which exclude the first heat generating component 4*a* and the second heat generating component 4*b*, and the circuit board 3 is easily conducted to the first projection 7*a* through the heat transfer member 11. Thus, the heat dissipation of the electronic control device 100 can be improved. In addition, the deformation or vibration of the circuit board 3 due to heat and the tolerance at the time of manufacturing can be absorbed by the deformation of the heat transfer member 11. Therefore, the electronic control device 100 having high reliability can be provided.

Third Embodiment

Figure 10:
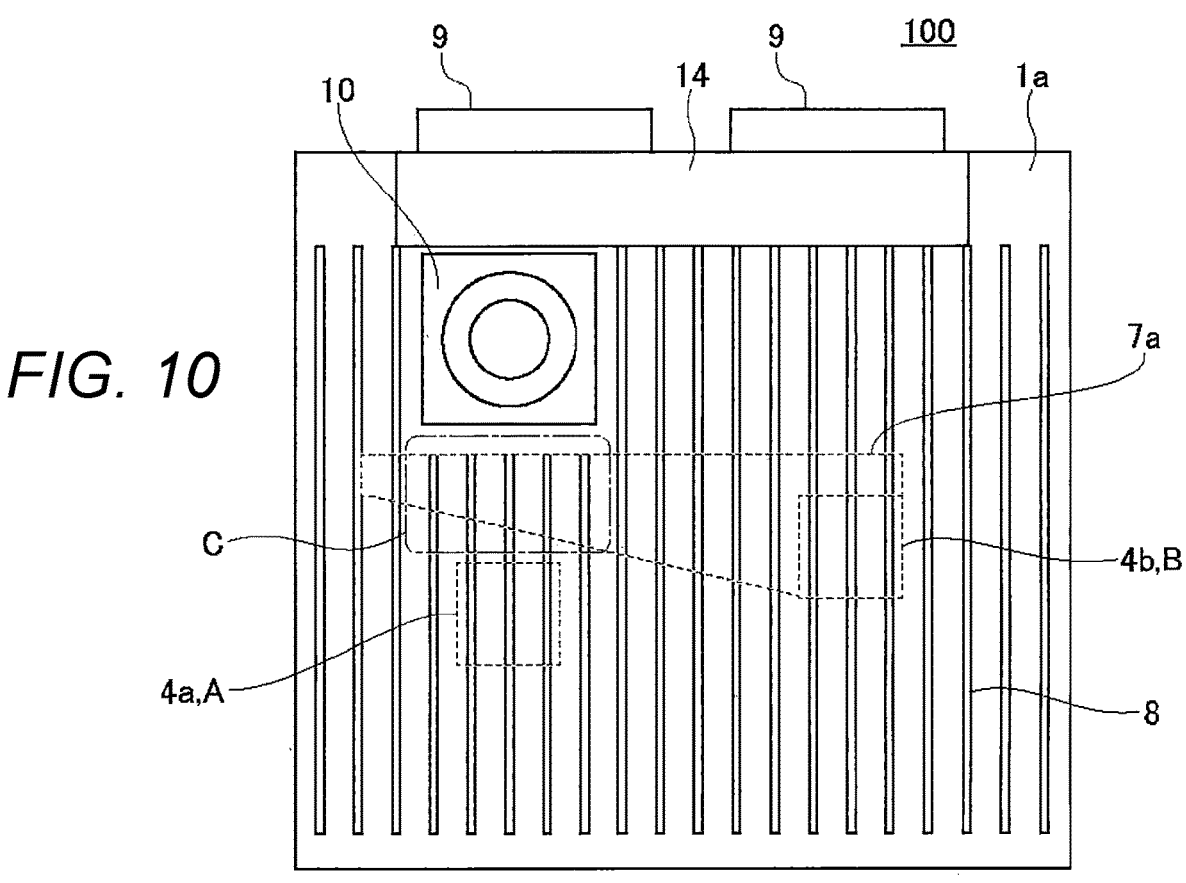
FIG. 10 is a top view of an electronic control device according to a third embodiment.
Figure 11:
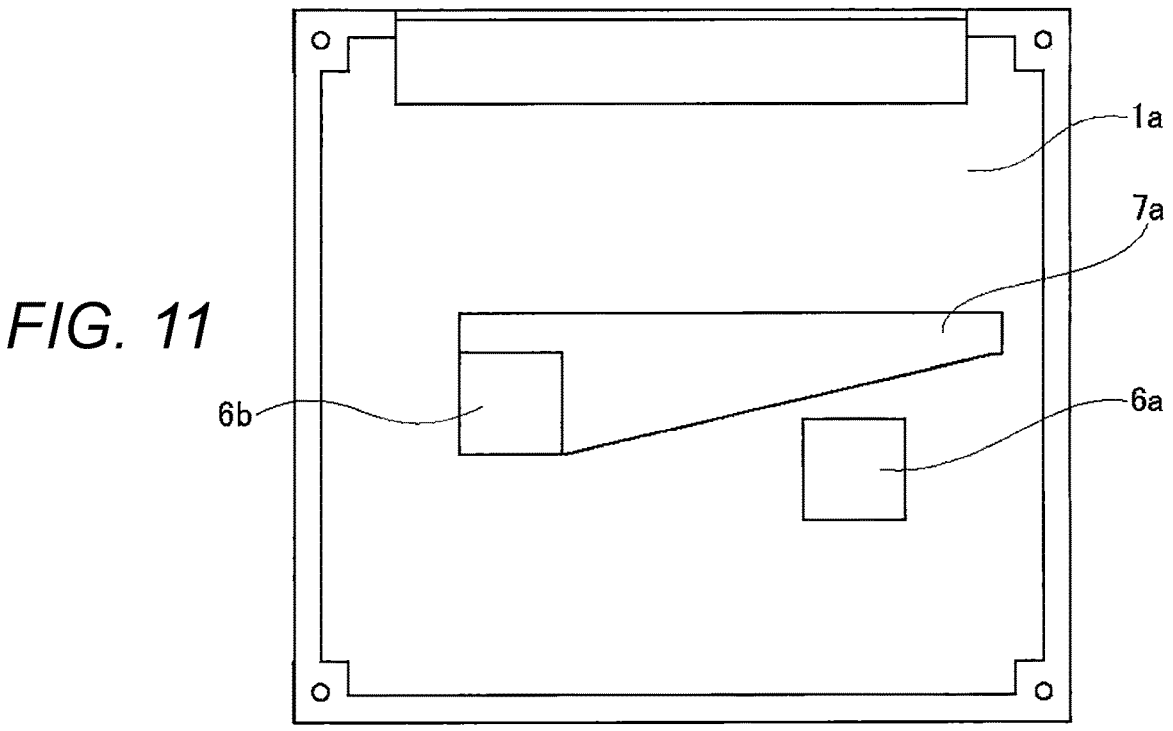
FIG. 11 is a bottom view of an upper housing included in the electronic control device illustrated in FIG. 10.

FIG. 10 is a top view of an electronic control device according to a third embodiment, and FIG. 11 is a bottom view of an upper housing included in the electronic control device illustrated in FIG. 10.

As illustrated in FIGS. 10 and 11, the electronic control device 100 according to the third embodiment is different from the above-described configuration (FIGS. 2 and 5) of the first embodiment in the shape of the first projection 7a. In the longitudinal direction of the first projection 7a, one end side (a left side in FIG. 11) of the first projection 7a is arranged in the state of being connected to two sides of the second boss 6b. In addition, the first projection 7a is formed such that the width thereof gradually decreases from the second region B toward the third region C, so as not to interfere with the first boss 6a. In addition, the other end side of the first projection 7a extends from the second region B toward the third region C similarly to the above-described first embodiment. In addition, the other end side of the first projection 7a is arranged in the state of crossing the third region C.

In the third embodiment, by arranging the first projection 7a such that one end side of the first projection 7a is connected to two sides of the second boss 6b, the heat of the second heat generating component 4b can be efficiently transmitted from the second boss 6b to the first projection 7a as compared with the above-described configuration of the first embodiment. In addition, since one end side of the first projection 7a is formed to be wide, the area of the first projection 7a is large as compared with the configuration of the first embodiment. Therefore, the thermal resistance at the time of transporting the heat of the second heat generating component 4b to the third region C is reduced. Therefore, the heat of the second heat generating component 4b is easily transported to the third region C through the first projection 7a. Thus, the heat dissipation of the electronic control device 100 can be improved.

Note that in FIG. 11, one end side of the first projection 7a is arranged to be connected to two sides of the second boss 6b, but the present invention is not limited thereto, and one end side of the first projection 7a may be arranged to be connected to three sides or four sides of the second boss 6b. In addition, the shape of the first projection 7a may be any shape as long as one end side of the first projection 7a is connected to two or more sides of the second boss 6b, and the other end side of the first projection 7a does not interfere with the first boss 6a. In addition, in order to improve the heat dissipation of the electronic control device 100, the first projection 7a preferably has a larger size.

Fourth Embodiment

Figure 12:
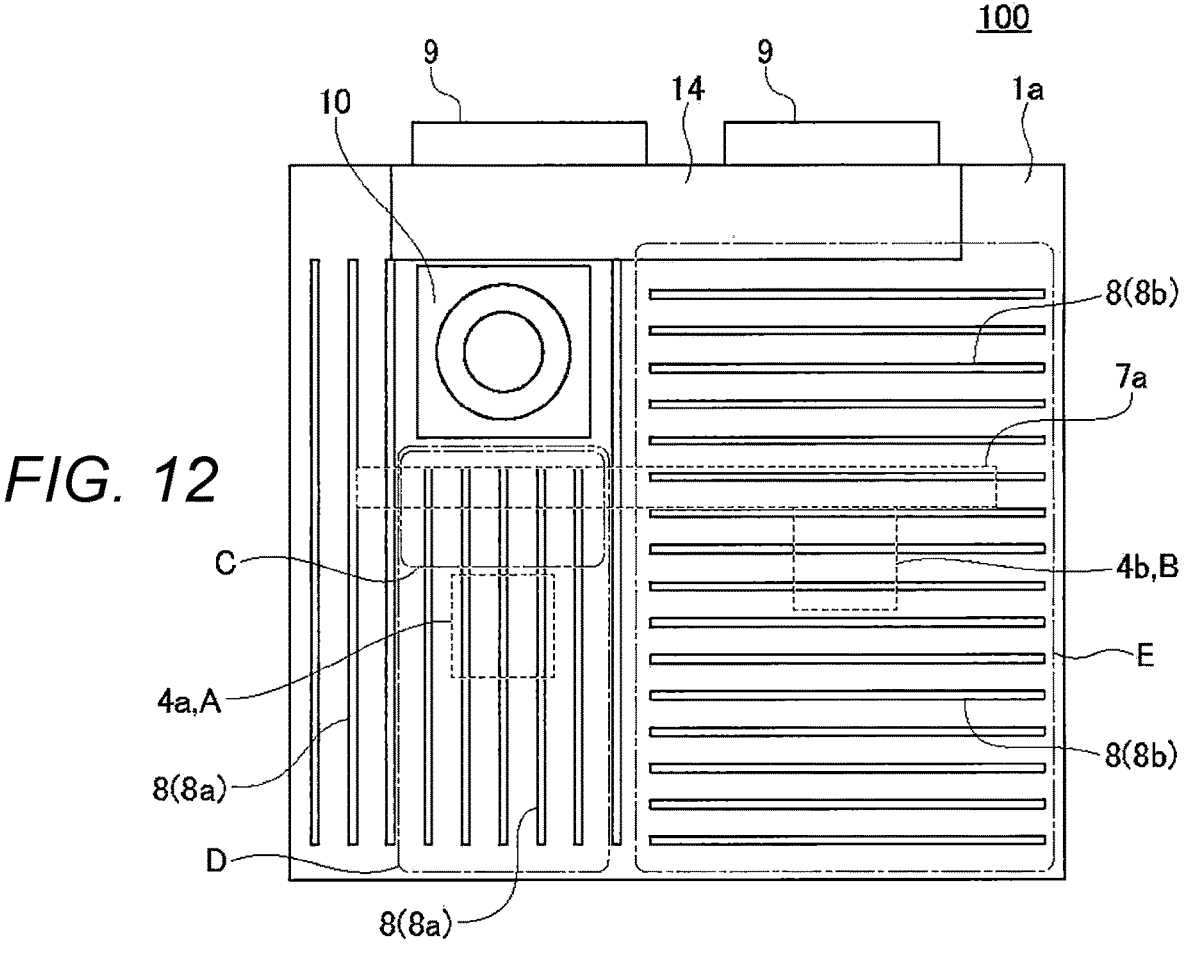
FIG. 12 is a top view of an electronic control device according to a fourth embodiment.

FIG. 12 is a top view of an electronic control device according to a fourth embodiment.

As illustrated in FIG. 12, the electronic control device 100 according to the fourth embodiment is different from the above-described configuration (FIG. 2) of the first embodiment in the orientation of the plurality of heat dissipation fins 8. Details will be described below.

First, among the plurality of heat dissipation fins 8 formed on the upper surface of the upper housing 1a, the heat dissipation fin 8a arranged on the first region A side is arranged in a direction along the air blowing direction of the fan 10 similarly to the first embodiment. On the other hand, heat dissipation fins 8b arranged on the second region B side are arranged at an angle different from that of heat dissipation fins 8a arranged on the first region A side. In addition, the heat dissipation fins 8b arranged in the vicinity of the second region B are arranged toward the forced air-cooling region D, which is the air blowing region of fan 10, at an angle different from the angle of the heat dissipation fins 8a. The heat dissipation fins 8b arranged in the natural air-cooling region E including the heat dissipation fins 8b arranged in the vicinity of the second region B are arranged in a direction orthogonal to the air blowing direction F (FIG. 1) of the fan 10. In other words, in FIG. 12, the heat dissipation fins 8a arranged on the first region A side are arranged vertically, and the heat dissipation fins 8b arranged on the second region B side are arranged horizontally.

In the fourth embodiment, the heat dissipation fins 8b arranged in the vicinity of the second region B are arranged toward the forced air-cooling region D including the third region C at an angle different from the angle of the heat dissipation fins 8a, so that the distribution of the heat transmitted from the second heat generating component 4b to the upper housing 1a spreads toward the forced air-cooling region D along the heat dissipation fins 8b. Therefore, the heat of the second heat generating component 4b can be efficiently transported to the forced air-cooling region D. In addition, as illustrated in FIG. 12, all the heat dissipation fins 8b arranged in the natural air-cooling region E, including the heat dissipation fins 8b arranged in the vicinity of the second region B and the heat dissipation fins 8b arranged at positions adjacent to the forced air-cooling region D, are arranged horizontally in a uniform manner, so that the heat dissipation of the heat generating component (including second heat generating component 4b) mounted in the natural air-cooling region E can be improved.

In FIG. 12, all the heat dissipation fins 8b arranged in the natural air-cooling region E are arranged horizontally, but the present invention is not limited thereto, and only the heat dissipation fins 8b arranged in the vicinity of the second region B may be arranged horizontally, or only the heat dissipation fins 8b arranged at positions adjacent to the forced air-cooling region D may be arranged horizontally. In addition, the orientation of the heat dissipation fins 8b is not limited to the orientation orthogonal to the air blowing direction F of the fan 10, and it is sufficient if the heat dissipation fins 8b are formed toward the forced air-cooling region D.

Fifth Embodiment

Figure 13:
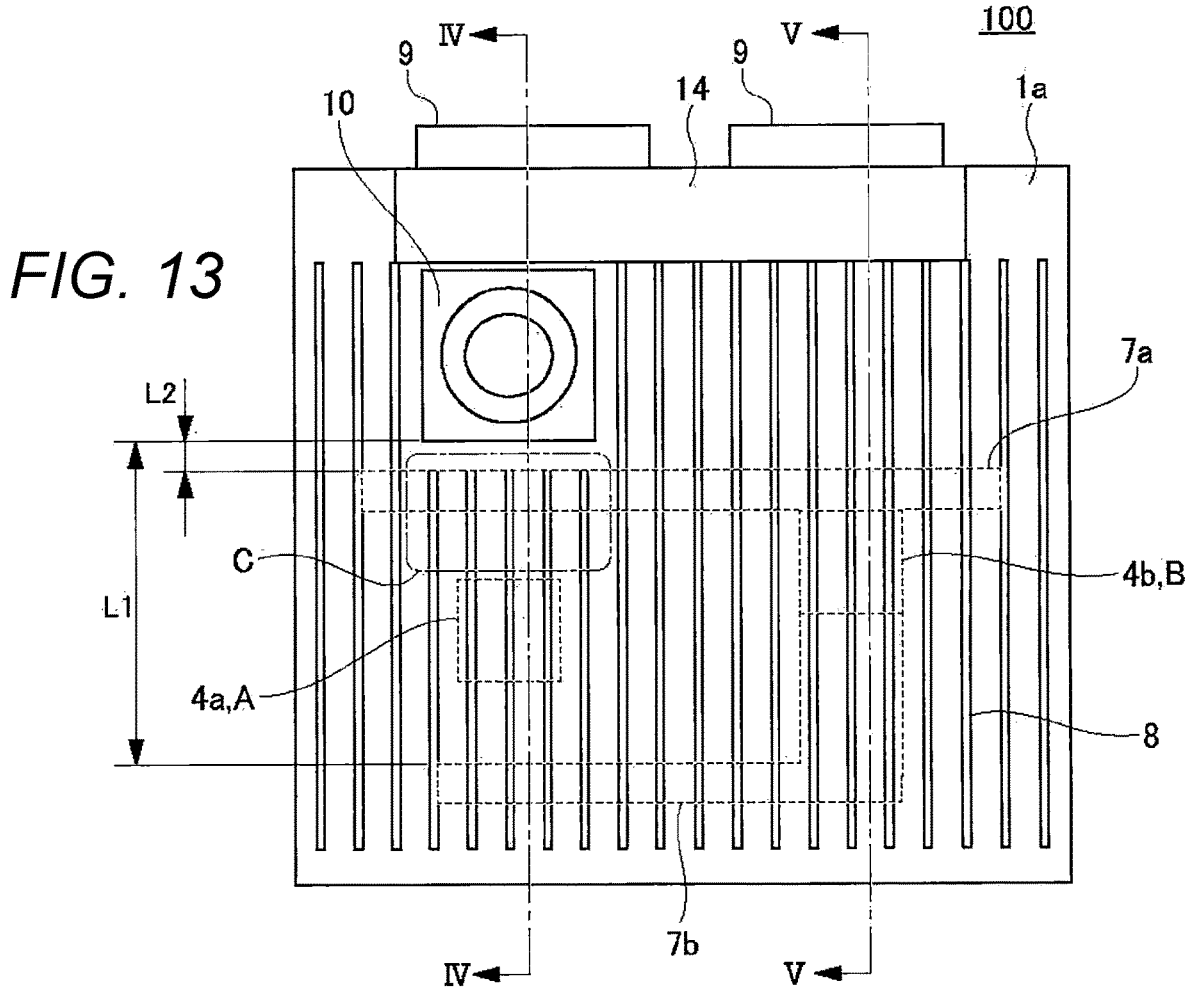
FIG. 13 is a top view of an electronic control device according to a fifth embodiment.
Figure 14:
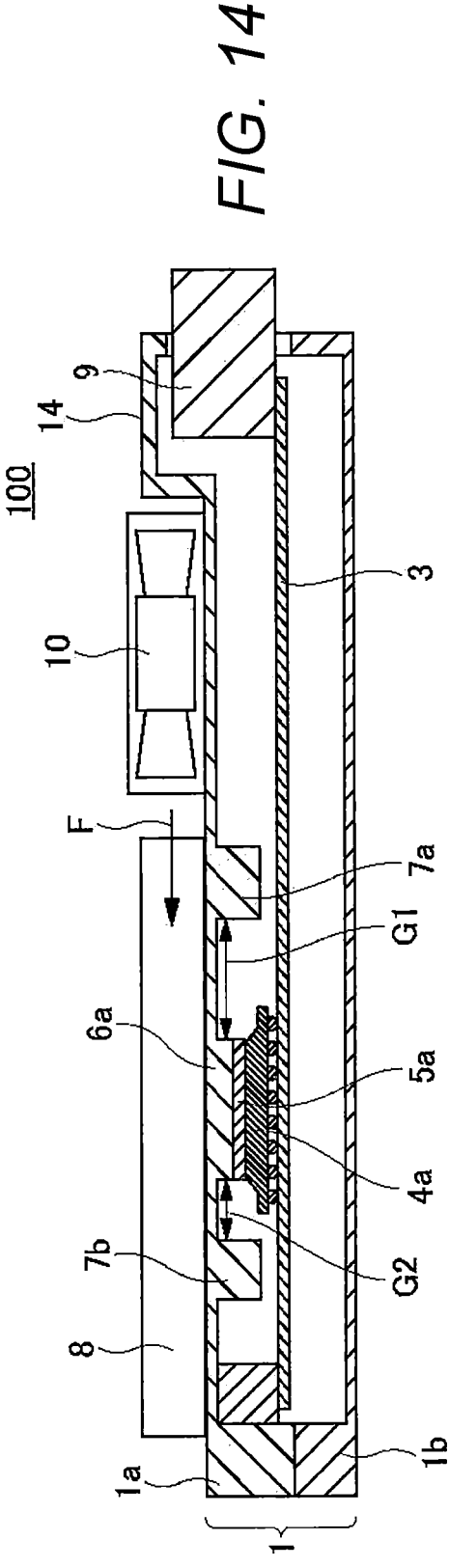
FIG. 14 is a cross-sectional view taken along line IV-IV of the electronic control device illustrated in FIG. 13.
Figure 15:
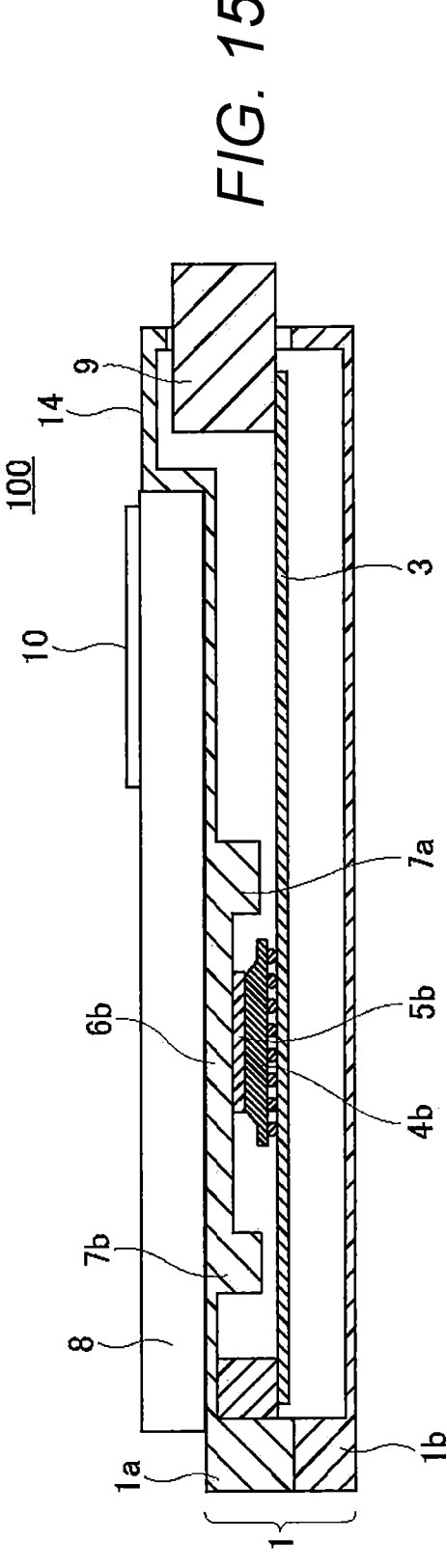
FIG. 15 is a cross-sectional view taken along line V-V of the electronic control device illustrated in FIG. 13.
Figure 16:
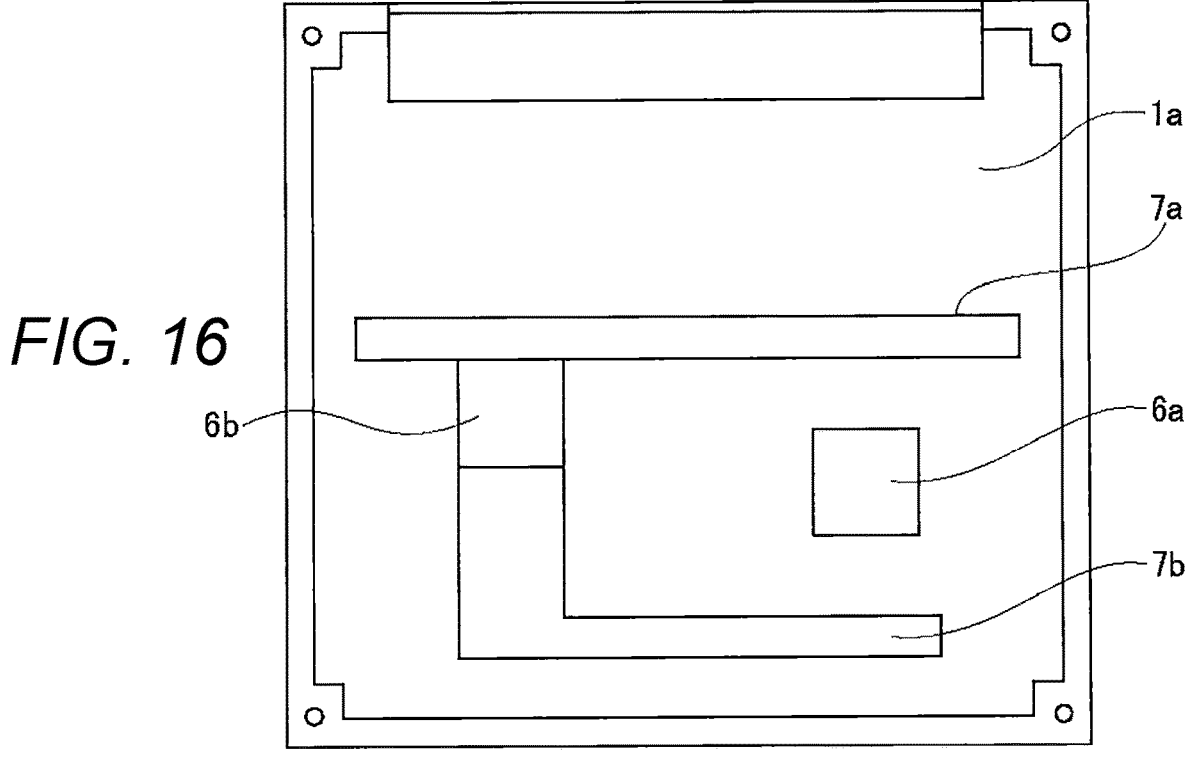
FIG. 16 is a bottom view of an upper housing included in the electronic control device illustrated in FIG. 13.

FIG. 13 is a top view of an electronic control device according to a fifth embodiment. In addition, FIG. 14 is a cross-sectional view taken along line IV-IV of the electronic control device illustrated in FIG. 13, and FIG. 15 is a cross-sectional view taken along line V-V of the electronic control device illustrated in FIG. 13. FIG. 16 is a bottom view of the upper housing included in the electronic control device illustrated in FIG. 13.

As illustrated in FIGS. 13 to 16, the electronic control device 100 according to the fifth embodiment is different from the above-described configuration (FIGS. 1 to 5) of the first embodiment in that a second projection 7b is provided in the housing 1. The second projection 7b is provided on the lower surface of the upper housing 1a. In addition, the second projection 7b is provided in the state of protruding from the lower surface of the upper housing 1a toward the circuit board 3. That is, the second projection 7b is formed as a protruding portion having a convex shape on the lower surface of the upper housing 1a. As illustrated in FIG. 16, the second projection 7b is formed in a shape bent at a right angle, that is, an L shape.

One end side of the second projection 7b is arranged in the state of being connected to the second boss 6b. In other words, the second projection 7b is arranged at a position continuous with the second boss 6b. In addition, one end side of the first projection 7a is connected to one side of the second boss 6b, and one end of the second projection 7b is connected to the other side of the second boss 6b positioned on the opposite side. That is, a part of the first projection 7a and a part of the second projection 7b are arranged to be continuous with each other with the second boss 6b interposed therebetween. Accordingly, the heat transferred from the second heat generating component 4b to the second boss 6b can be released to both the first projection 7a and the second projection 7b.

The other end side of the second projection 7b extends to the downstream side of the first region A in the air blowing direction (FIG. 1) of the fan 10. Accordingly, the other end side of the second projection 7b can be directly cooled by the air blown from the fan 10. In addition, the other end of the second projection 7b is arranged at a position farther from the fan 10 as compared to the third region C and the first region A. As illustrated in FIG. 13, a distance L1 between the closest point of the second projection 7b to the fan 10 and the fan 10 is longer than a distance L2 between the closest point of the first projection 7a to the fan 10 and the fan 10. Accordingly, when air is sent from the fan 10, the other end side of the first projection 7a can be cooled more preferentially than the other end side of the second projection 7b. In addition, as illustrated in FIG. 14, in the air blowing direction F of the fan 10, the first projection 7a and the first boss 6a are arranged at a first interval G1, and the second projection 7b and the first boss 6a are arranged at a second interval G2. Accordingly, it is possible to suppress interference between the heat of the second heat generating component 4b transported to the forced air-cooling region through the first projection 7a and the second projection 7b and the heat of the first heat generating component 4a mounted in the first region A in the forced air-cooling region.

In the fifth embodiment, by providing the second projection 7b on the lower surface of the upper housing 1a, the heat dissipation path for releasing the heat of the second heat generating component 4b increases. Further, the other end side of the second projection 7b is cooled by the air blown by the fan 10. Therefore, a temperature gradient increases between one end of the second projection 7b positioned in the vicinity of the second region B and the other end of the second projection 7b positioned in the forced air-cooling region, and this temperature gradient promotes heat transfer in the second projection 7b. Thus, the heat of the second heat generating component 4b can be efficiently transported to the forced air-cooling region side.

Note that the second projection 7b is formed integrally with the upper housing 1a by casting such as die casting similarly to the first projection 7a, but the present invention is not limited thereto, and the second projection 7b may be manufactured as a separate member from the upper housing 1a, for example, a heat pipe, a vapor chamber, or a member made of a metal material having high thermal conductivity such as Cu or Al, and this member may be attached to the upper housing 1a.

Sixth Embodiment

Figure 17:
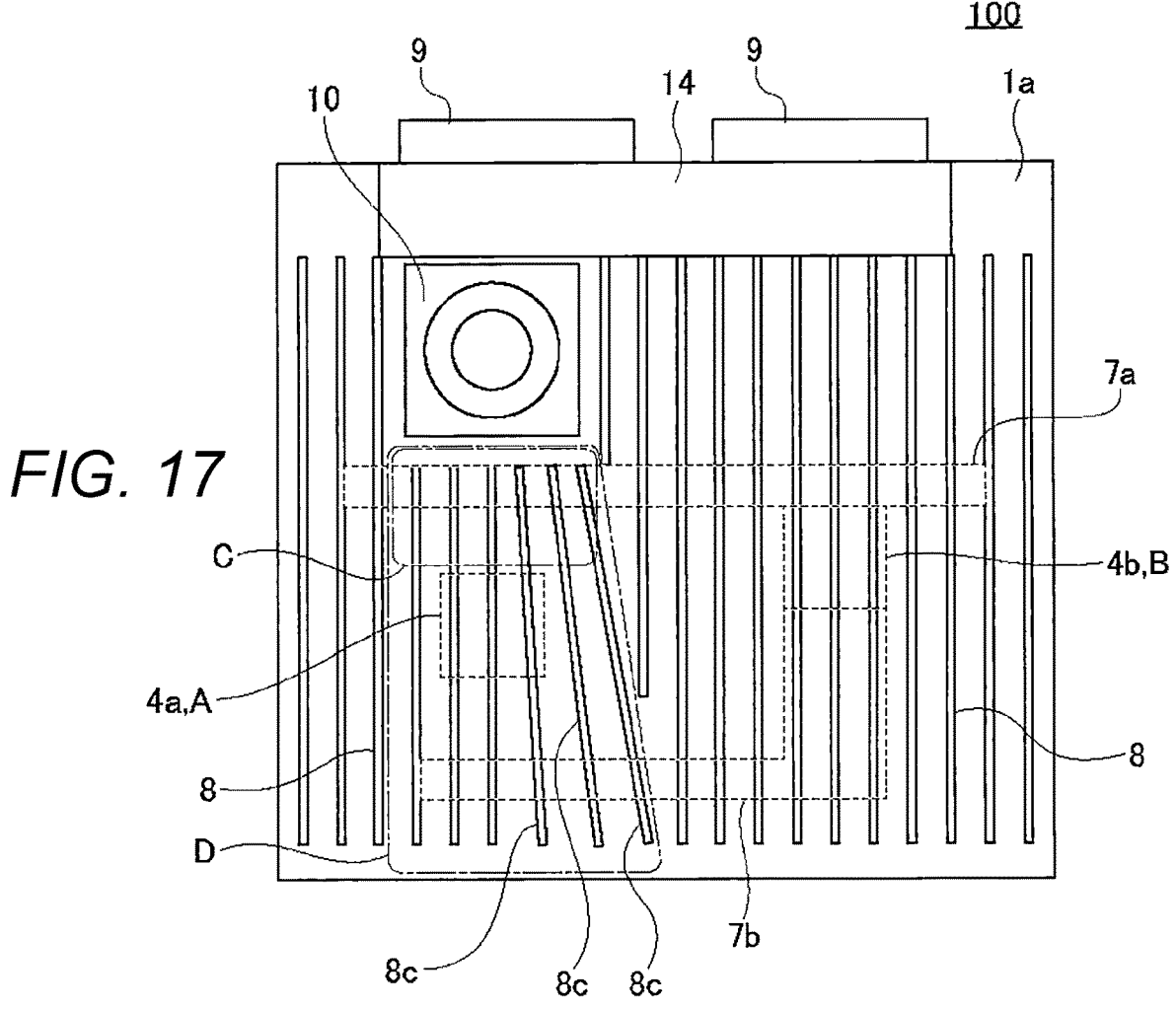
FIG. 17 is a top view of an electronic control device according to a sixth embodiment.

FIG. 17 is a top view of an electronic control device according to a sixth embodiment.

As illustrated in FIG. 17, the electronic control device 100 according to the sixth embodiment is different from the above-described configuration (FIG. 13) of the fifth embodiment in the orientation of the heat dissipation fins 8 arranged in the air blowing direction of the fan 10 among the plurality of heat dissipation fins 8 formed on the upper surface of the upper housing 1a.

Specifically, among the plurality of heat dissipation fins 8 arranged in the air blowing direction of the fan 10, a predetermined heat dissipation fin 8c is inclined with respect to the air blowing direction of the fan 10 so as to expand the air blowing region (forced air-cooling region D) of the fan 10 to the second region B side. In addition, an interval between the heat dissipation fins 8c adjacent to each other in the direction orthogonal to the air blowing direction of the fan 10 gradually increases as a distance from the fan 10 increases. In addition, focusing on each of the heat dissipation fins 8c, one end of the heat dissipation fin 8c is arranged in the third region C, and the other end of the heat dissipation fin 8c is arranged closer to the natural air-cooling region (right side in FIG. 17) than one end of heat dissipation fin 8c due to the inclination of the heat dissipation fin 8c itself.

In the sixth embodiment, the air blowing region of the fan 10 is expanded to the second region B side due to the inclination of the heat dissipation fin 8c arranged in the air blowing direction of the fan 10, so that the housing 1 can be forcibly air-cooled in a wider range. In addition, since the area of the second projection 7b arranged in the air blowing region of the fan 10 increases, the heat of the heat generating component (including the second heat generating component 4b) mounted in the natural air-cooling region can be efficiently transported to the forced air-cooling region D as compared with the above-described fifth embodiment. In addition, the heat dissipation fins 8c are formed obliquely at an angle from the third region C positioned in the vicinity of the blower port of the fan 10. Therefore, most of the air sent from the fan 10 to the space between the heat dissipation fins 8c can flow to a position deviated from the portion immediately above the mounting position of the first heat generating component 4a. Accordingly, on the downstream side of the first region A in the air blowing direction of the fan 10, not only the air heated by taking the heat of the first heat generating component 4a but also the cooled air sent from the fan 10 can flow. Therefore, the other end side of the second projection 7b can be efficiently cooled by the air blown from the fan 10. In addition, it is possible to suppress interference between the heat of the second heat generating component 4b transported to the forced air-cooling region D through the second projection 7b and the heat of the first heat generating component 4a mounted in the first region A in the forced air-cooling region D.

Seventh Embodiment

Figure 18:
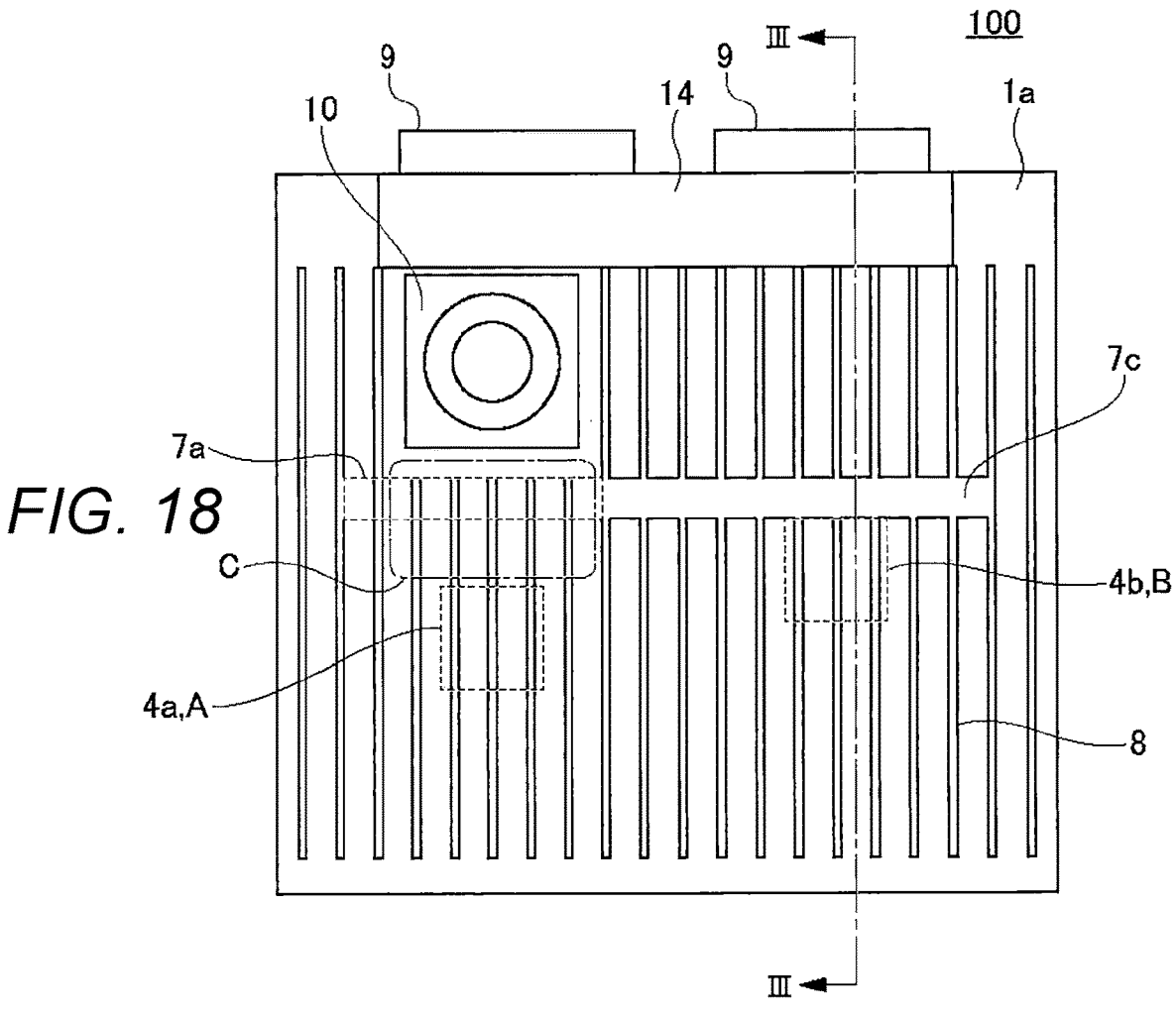
FIG. 18 is a top view of an electronic control device according to a seventh embodiment.
Figure 19:
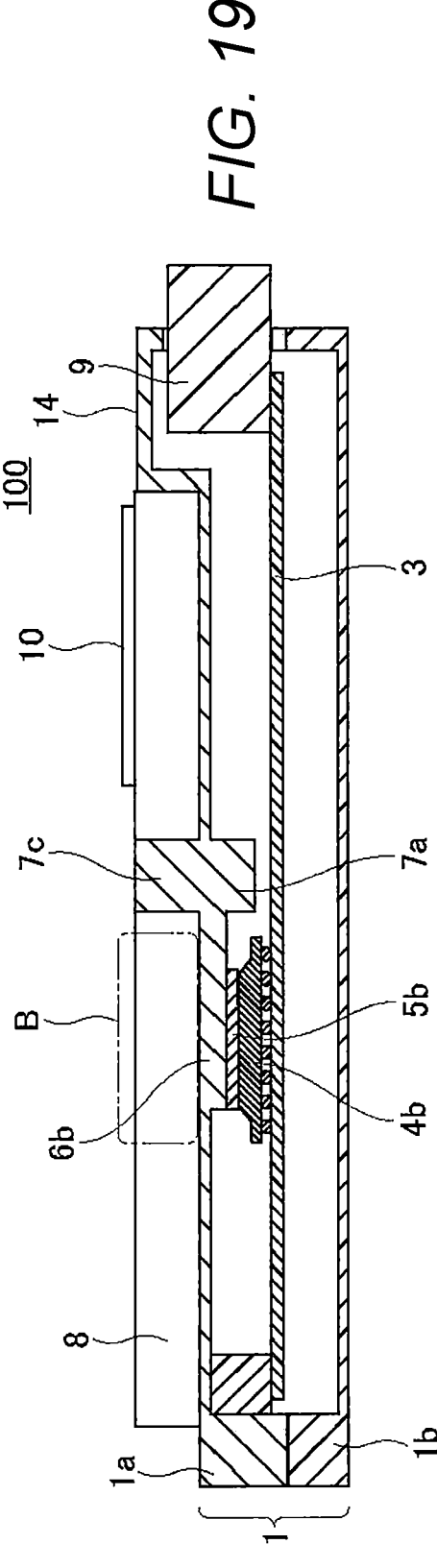
FIG. 19 is a cross-sectional view taken along line III-III of the electronic control device illustrated in FIG. 18.

FIG. 18 is a top view of an electronic control device according to a seventh embodiment, and FIG. 19 is a cross-sectional view taken along line III-III of the electronic control device illustrated in FIG. 18.

As illustrated in FIGS. 18 and 19, the electronic control device 100 according to the seventh embodiment is different from the above-described configuration (FIGS. 2 and 4) of the first embodiment in that a third projection 7c is provided in the upper housing 1a of the housing 1. The third projection 7c is provided on the upper surface of the upper housing 1a together with the heat dissipation fin 8. The third projection 7c protrudes to the side opposite to the first projection 7a in the thickness direction of the upper housing 1a.

The protruding dimension of the third projection 7c based on the upper surface of the upper housing 1a is set to be the same as the protruding dimension of the heat dissipation fin 8. In addition, the third projection 7c extends from the vicinity of the second region B to the front of the third region C. More specifically, in the longitudinal direction of the third projection 7c, one end (the right end in FIG. 18) of the third projection 7c is arranged at substantially the same position as one end of the first projection 7a, and the other end of the third projection 7c is arranged in the immediate vicinity of the third region C so as not to obstruct the air blowing of the fan 10. In addition, the third projection 7c is formed along the first projection 7a. Note that the direction and shape of the third projection 7c are not limited to the examples illustrated in FIGS. 18 and 19, and can be changed as necessary. For example, by setting the protruding dimension of the third projection 7c to be larger than the protruding dimension of the heat dissipation fin 8, the efficiency of heat transport by the third projection 7c may be increased.

In the seventh embodiment, by providing the third projection 7c in the upper housing 1a, the cross-sectional area for transporting the heat of the second heat generating component 4b to the third region C is increased as compared with a case where only the first projection 7a is provided. Accordingly, a thermal resistance at the time of transporting the heat of the second heat generating component 4b to the third region C is reduced, so that the heat dissipation of the electronic control device 100 can be improved. In addition, the third projection 7c extends from the vicinity of the second region B to the front of the third region C, but is not provided in the third region C. Therefore, heat can be transported by the third projection 7c without adversely affecting the air blowing of the fan 10 (without deteriorating the fan performance). Therefore, the heat dissipation of the second heat generating component 4b can be improved while maintaining the heat dissipation of the first heat generating component 4a.

Note that the present invention is not limited to the above-described embodiments, and includes various modifications. For example, in the above-described embodiments, the contents of the present invention are described in detail for easy understanding, but the present invention is not necessarily limited to one including all the configurations described in the above-described embodiments. In addition, a part of the configuration of one embodiment can be replaced with the configuration of another embodiment. In addition, the configuration of one embodiment can be added with the configuration of another embodiment. In addition, a part of the configuration of each embodiment can be deleted, added with another configuration, or replaced with another configuration.

REFERENCE SIGNS LIST 1 housing
3 circuit board
4a first heat generating component
4b second heat generating component
5a first heat transfer material
5b second heat transfer material
6a first boss
6b second boss
7a first projection
7b second projection
7c third projection
8, 8a, 8b, 8c heat dissipation fin
9 connector 10 fan
11 heat transfer member
100 electronic control device
A first region
B second region
C third region
F air blowing direction
G1 first interval
G2 second interval

The invention claimed is:

1. An electronic control device comprising:
a housing which has an inner surface provided with a plurality of bosses including a first boss and a second boss;
a circuit board which is housed in an internal space of the housing;
a first heat generating component which is mounted on the circuit board and thermally connected to the housing via the first boss;
a second heat generating component which is mounted on the circuit board and thermally connected to the housing via the second boss;
a plurality of heat dissipation fins which are formed on an outer surface of the housing; and
a fan which is mounted on the outer surface of the housing and blows air toward the heat dissipation fin,
wherein a first projection protruding toward the circuit board is provided on the inner surface of the housing, and
when, in the housing, a region immediately above a mounting position of the first heat generating component is defined as a first region, a region immediately above a mounting position of the second heat generating component is defined as a second region, and a region between the first region and the fan in an air blowing direction of the fan is defined as a third region,
one end side of the first projection is arranged in a state of being connected to the second boss, and
another end side of the first projection extends toward the third region so as to transport heat generated by the second heat generating component to the third region.

2. The electronic control device according to claim 1, wherein the one end side of the first projection is arranged to be connected to at least two sides of the second boss.

3. The electronic control device according to claim 1, wherein
a second projection protruding toward the circuit board is further provided on the inner surface of the housing,
one end side of the second projection is arranged in a state of being connected to the second boss, and
another end side of the second projection extends to a downstream side of the first region in the air blowing direction of the fan.

4. The electronic control device according to claim 3, wherein a part of the first projection and a part of the second projection are arranged to be continuous with the second boss interposed therebetween.

5. The electronic control device according to claim 3, wherein a distance between a closest point to the fan in the second projection and the fan is longer than a distance between a closest point to the fan in the first projection and the fan.

6. The electronic control device according to claim 3, wherein in the air blowing direction of the fan, the first projection and the first boss are arranged at a first interval, and the second projection and the first boss are arranged at a second interval.

7. The electronic control device according to claim 1, further comprising a heat transfer member which thermally connects the first projection and the circuit board.

8. The electronic control device according to claim 1, wherein among the plurality of heat dissipation fins formed on the outer surface of the housing, a predetermined heat dissipation fin arranged in the air blowing direction of the fan is inclined with respect to the air blowing direction of the fan so as to expand an air blowing region of the fan toward the second region.

9. The electronic control device according to claim 1, wherein the housing is provided with a third projection protruding to a side opposite to the first projection, and the third projection extends from a vicinity of the second region to a front of the third region.

10. The electronic control device according to claim 1, wherein an amount of heat generated by the first heat generating component is larger than an amount of heat generated by the second heat generating component.

11. The electronic control device according to claim 1, wherein a connector for external connection is arranged on one side of the housing, and the fan is arranged in a vicinity of the connector.

12. The electronic control device according to claim 1, wherein the fan is a centrifugal fan or a blower fan.

13. The electronic control device according to claim 1, wherein the first heat generating component and the first boss are connected by a first heat transfer material, and the second heat generating component and the second boss are connected by a second heat transfer material.

14. The electronic control device according to claim 1, wherein among the plurality of heat dissipation fins formed on the outer surface of the housing, a heat dissipation fin arranged in a vicinity of the second region is arranged toward an air blowing region of the fan at an angle different from an angle of a heat dissipation fin arranged on a side of the first region.

15. The electronic control device according to claim 14, wherein the heat dissipation fin arranged in the vicinity of the second region is arranged in a direction orthogonal to the air blowing direction of the fan.

\* \* \* \* \*